(12) United States Patent
Lambert et al.

(10) Patent No.: US 12,132,015 B2
(45) Date of Patent: Oct. 29, 2024

(54) PACKAGE EMBEDDED MAGNETIC INDUCTOR STRUCTURES AND MANUFACTURING TECHNIQUES FOR 5-50 MHZ SMPS OPERATIONS

(71) Applicant: Intel Corporation, Santa Clara, CA (US)

(72) Inventors: William J. Lambert, Chandler, AZ (US); Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1093 days.

(21) Appl. No.: 16/665,682

(22) Filed: Oct. 28, 2019

(65) Prior Publication Data

US 2021/0125944 A1 Apr. 29, 2021

(51) Int. Cl.
*H01L 23/64* (2006.01)
*H01F 27/28* (2006.01)
(Continued)

(52) U.S. Cl.
CPC ....... *H01L 23/645* (2013.01); *H01F 27/2804* (2013.01); *H01F 27/327* (2013.01); *H01F 41/041* (2013.01); *H01F 41/127* (2013.01); *H01L 21/486* (2013.01); *H01L 23/49827* (2013.01); *H01L 23/49838* (2013.01); *H01L 24/16* (2013.01); *H01F 2027/2809* (2013.01); *H01L 2224/16225* (2013.01);
(Continued)

(58) Field of Classification Search
CPC .... H01F 27/327; H01F 41/041; H01F 41/127; H01F 2027/2809; H01F 17/062; H01F 41/046; H01F 17/0033; H01F 27/2804; H01L 23/645; H01L 21/486; H01L 23/49827; H01L 23/49838; H01L 24/16; H01L 2224/16225; H01L 2924/1427; H01L 2924/18161; H01L 2924/19103; H01L 23/49816; H01L 23/49822; H01L 23/49833
See application file for complete search history.

(56) References Cited

U.S. PATENT DOCUMENTS

| | | | |
|---|---|---|---|
| 2015/0213946 A1* | 7/2015 | Mano | H01F 17/04 336/200 |
| 2019/0206597 A1* | 7/2019 | Brown | H01L 23/49894 |
| 2019/0272936 A1* | 9/2019 | Zhang | H01L 28/10 |

* cited by examiner

*Primary Examiner* — Malcolm Barnes
(74) *Attorney, Agent, or Firm* — Schwabe, Williamson & Wyatt, P.C.

(57) ABSTRACT

Embodiments include inductors and methods to form the inductors. An inductor includes a substrate layer that surrounds a magnetic layer, where the magnetic layer is embedded between the substrate layer. The inductor also includes a dielectric layer that surrounds the substrate and magnetic layers, where the dielectric layer fully embeds the substrate and magnetic layers. The inductor further includes a first conductive layer over the dielectric layer, a second conductive layer below the dielectric layer, and a plurality of plated-through-hole (PTH) vias in the dielectric and substrate layers. The PTH vias vertically extend from the first conductive layer to the second conductive layer, and the magnetic layer in between the PTH vias. The magnetic layer may have a thickness that is substantially equal to a thickness of the substrate layer, where the thickness of the magnetic layer is less than a thickness defined between the first and second conductive layers.

10 Claims, 10 Drawing Sheets

(51) Int. Cl.
*H01F 27/32* (2006.01)
*H01F 41/04* (2006.01)
*H01F 41/12* (2006.01)
*H01L 21/48* (2006.01)
*H01L 23/00* (2006.01)
*H01L 23/49* (2006.01)
*H01L 23/498* (2006.01)

(52) U.S. Cl.
CPC .................. *H01L 2924/1427* (2013.01); *H01L 2924/18161* (2013.01); *H01L 2924/19103* (2013.01)

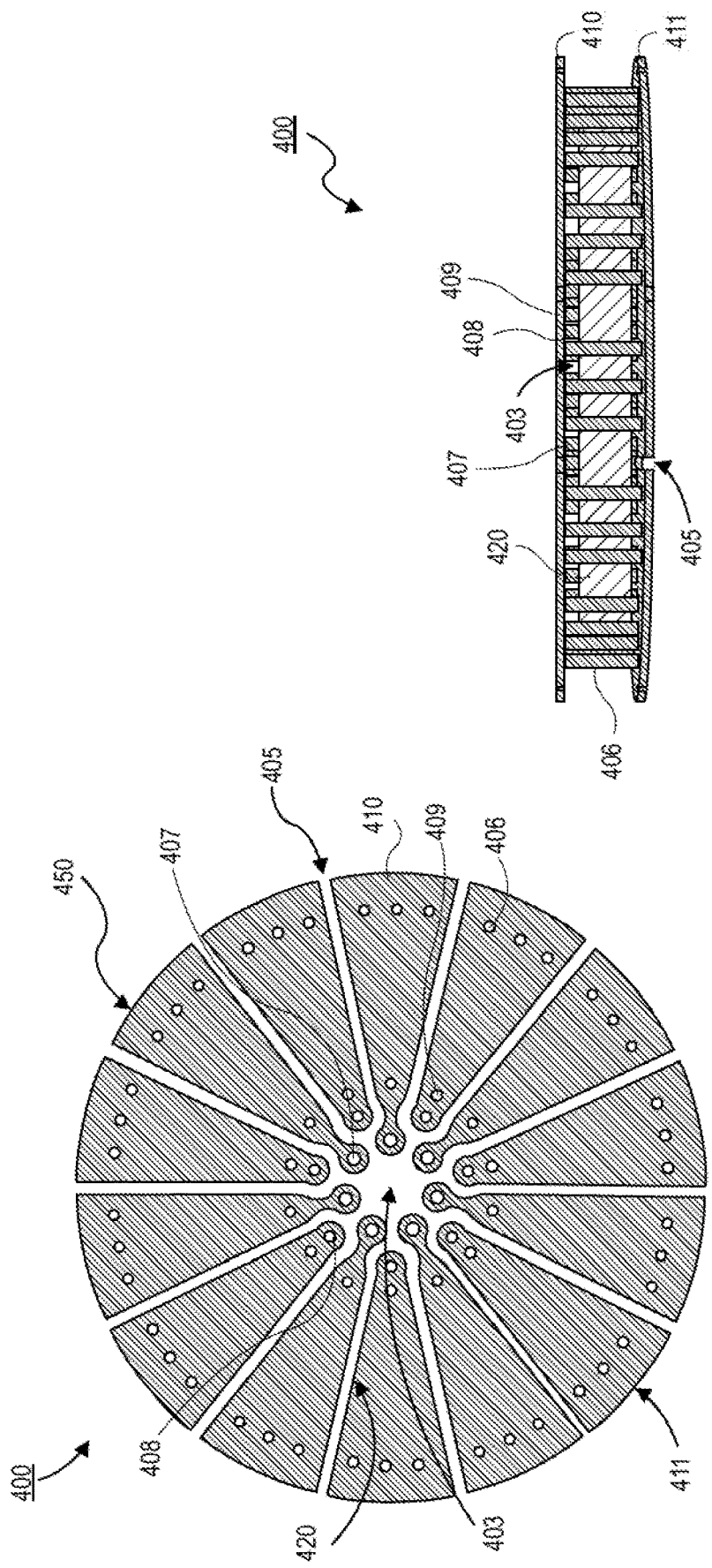

PACKAGE EMBEDDED MAGNETIC INDUCTOR STRUCTURES AND MANUFACTURING TECHNIQUES FOR 5-50 MHZ SMPS OPERATIONS

FIELD

Embodiments relate to packaging semiconductor devices. More particularly, the embodiments relate to semiconductor devices with embedded magnetic inductors for switched-mode power supply (SMPS) operations.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with embedded magnetic inductors, while optimizing the performance of the semiconductor devices, however is not without issue.

Semiconductor devices typically utilize packaged magnetic inductors with voltage regulators, such as fully integrated voltage regulators (FIVRs), for voltage power regulation. FIVRs are generally implemented to operate at lower input voltages and, in most cases, also require operating at higher switching frequencies. Existing technologies, however, are pursuing on-package voltage regulators that can operate at higher input voltages (e.g., as compared to FIVRs) and lower switching frequencies.

An existing packaging solution is to use discrete inductors with the semiconductor packages. Discrete inductors are generally available with different thicknesses, but are limited when designed with low thicknesses (or z-heights). As such, these discrete inductors may be embedded within the packages, particularly for taller server parts, but embedded inductors also have limitations for design flexibility, range of achievable values, and so on.

Additionally, most discrete inductors are generally too thick for die-side assemblies and other similar packaging applications, which thereby limits the respective assembly rules, maximum thicknesses, etc., and severely limits the number of locations and quantities that are available for the semiconductor packages. Embedding a discrete component (e.g., a discrete inductor) in a core of a package can avoid some of these limitations, but such component can generally require a core of 700 um or thicker, which is not a good or reliable option for client processing/packaging parts (e.g., central processing unit (CPU) parts). Furthermore, another issue with using discrete inductors is that such inductors typically require substantially high volumes to be produced, and may thus make optimizing inductor designs on a per-rail basis substantially more expensive.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 4A is an illustration of a plan view of a toroidal inductor with a magnetic layer, a plurality of PTH vias, and a plurality of conductive layers, according to one embodiment.

FIG. 4B is an illustration of a cross-sectional view of a toroidal inductor with a magnetic layer, a plurality of PTH vias, and a plurality of conductive layers, according to one embodiment.

DETAILED DESCRIPTION

Figure 1:
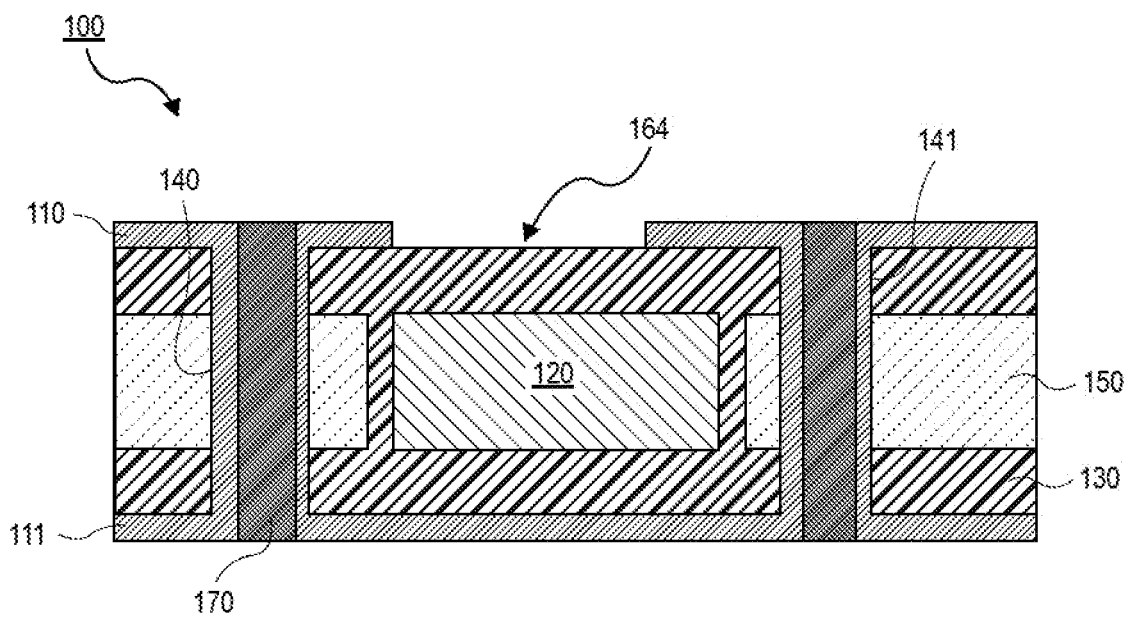
FIG. 1 is an illustration of a cross-sectional view of an inductor with a magnetic layer, a dielectric layer, a substrate layer, a plurality of plated-through hole (PTH) vias, and a plurality of conductive layers, according to one embodiment.

Described herein are semiconductor devices with magnetic inductors and methods of forming such magnetic inductors. The semiconductor devices with magnetic inductors described below and methods of forming such magnetic inductors may include a magnetic layer, a dielectric layer, a substrate layer, a plurality of plated-through hole (PTH) vias, and a plurality of conductive layers, according to some embodiments. In some embodiments, the inductors described herein may include magnetic cores (or magnetic layers) and conductive windings (e.g., the conductive traces, the PTH vias, etc.) embedded in (and/or disposed on) a package substrate to implement multi-turn higher valued magnetic inductors.

The embodiments described below include semiconductor devices with on-package voltage regulators that may implement magnetic inductors to operate at higher input voltages and lower switching frequencies. For example, the semiconductor device described herein may operate with lower switching frequencies and higher input voltages by implementing such magnetic inductors in the range of 5-100 nH (or greater) based on one or more design parameters (e.g., switching frequency, input voltage, load, etc.), while maintaining a low direct current (DC) resistance of 1-100 mΩ.

These embodiments may include a magnetic core (or a magnetic layer) with a relative magnetic permeability between, for example, 10-200 nH that is embedded into (or disposed in/on) a build-up layer, a substrate core (or a substrate layer), and/or the like, where subsequently a plurality of traces and PTH vias may be used to create windings around the magnetic core. In some embodiments, the PTH vias of the inductors may be implemented through an insulating material outside the area of the embedded magnetic core, and/or directly (or solely) through the magnetic layer/material. These PTHs may thus implement power inductors with DC resistance of 1-100 mΩ in the range of 5-100 nH (or greater), according to some embodiments.

The embodiments described herein provide improvements to existing packaging solutions by enabling magnetic inductors large enough to implement $V_{IN}$=5V (or 12V) to $V_{out}$=1.8V (or 1.0V) conversion at 10-100 MHz switching frequency, and enabling such magnetic inductors to be embedded into (or disposed on/in) a package substrate with a substantially low z-height. These embodiments also improve the existing packaging solutions by implementing low-cost, custom magnetic inductors (i) with substantially low z-heights using a low-cost technology, (ii) with greater ability to customize the inductor designs for even substantially smaller volumes, and (iii) with the ability to create custom inductor arrays instead of individual surface mount components or the like.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages/devices that have embedded magnetic inductors (or magnetic inductors) with magnetic layers, dielectric layers, substrate (or build-up) layers, PTH vias, and conductive layers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of an inductor 100 is shown, in accordance with an embodiment. In an embodiment, the inductor 100 may include a magnetic layer 120, a dielectric layer 130, a substrate layer 150, a plurality of PTH vias 140-141, and a plurality of conductive layers 110-111. In one embodiment, the inductor 100 may be an embedded magnetic inductor, an on-package inductor, a magnetic inductor, and/or the like.

For some embodiments, the inductor 100 may include the magnetic layer 120 embedded into the substrate layer 150 and the dielectric layer 130, where the PTH vias 140-141 and the conductive layers 110-111 may be implemented to form a plurality of conductive windings around the magnetic layer 120. In some embodiments, the embedded magnetic layer 120 and the conductive windings of the PTH vias 140-141 and the conductive layers 110-111 may be implemented to form the embedded magnetic inductor 100.

In some embodiments, the inductor 100 may be implemented (or designed) with one or more shaped configurations. In an embodiment, the inductor 100 may be implemented with a toroidal shape with one or more parameters (e.g., as shown with the toroidal shape of the inductor 400 of FIGS. 4A-4C). For example, the inductor 100 may be a toroidal-shaped inductor with one or more parameters that include an inner radius of the magnetic layer 120 (e.g., an inner radius of approximately 0.4 mm to 1.0 mm), an outer radius of the magnetic layer 120 (e.g., an outer radius of approximately 1.4 mm to 2.2 mm), an inner radius of the PTH vias 140-141 (e.g., an inner radius of approximately 0.6 mm to 1.2 mm), an outer radius of the PTH vias 140-141 (e.g., an outer radius of approximately 1.2 mm to 2.0 mm), a total number of turns (e.g., a total number of turns approximately between 17 and 32), and so on.

For example, the toroidal shape allows for a well-defined, closed flux path in the magnetic layer 120 of the inductor 100, which thus allows the inductance of the inductor 100 to be controlled approximately as the square of the number of conductive windings/turns of the conductive layers 110-111 and the PTH vias 140-141 routed around the magnetic layer 120. Likewise, in other embodiments, the inductor 100 may be implemented with other shapes (or configurations), such as a solenoid wrapped around a rectangular magnetic core, a bar (or rectangle) wrapped around a rectangular magnetic core, and so on. Note that, in some embodiments, the magnetic layer 120 may have a rectangular shape, a circular (or rounded-edges) shape, and so on.

For some embodiments, the inductor 100 may be embedded into a package substrate, and/or the inductor 100 may be disposed on/in the package substrate. For one embodiment, the package substrate may include, but is not limited to, a package, a substrate, a printed circuit board (PCB), and a motherboard. For one embodiment, the package substrate is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more mold layers and/or one or more dielectric layers, where each dielectric layer may be a photosensitive dielectric layer. For one embodiment, the PCB may include a plurality of conductive layers (e.g., the PTH vias 140-141, the conductive layers 110-111, etc.), which may further include copper (or metallic) traces, lines, pads, vias, via pads, holes, and/or planes. Furthermore, the package substrate may also include the dielectric layer 130 and the substrate layer 150 of the inductor 100.

As shown in FIG. 1, according to some embodiments, the substrate layer 150 may be a core substrate, a coreless substrate, an organic core/coreless substrate, and/or the like. In some embodiments, the substrate layer 150 may have a thickness of approximately 200 um to 1.5 mm. In other embodiments, the substrate layer 150 may have a thickness of approximately 200 um or less. In some embodiments, the substrate layer 150 may include one or more materials such as epoxy, glass (or glass fibers), and/or the like. For example, the substrate layer 150 may be a glass fiber reinforced core substrate. In one embodiment, the substrate layer 150 may surround the magnetic layer 120.

For one embodiment, the magnetic layer 120 may be a magnetic core substrate, a magnetic coreless substrate, and/or the like. The magnetic layer 120 may include one or more magnetic materials. For example, the magnetic layer 120 may include one or more magnetic materials that exhibit the desired magnetic behavior properties needed for the implementation of higher valued inductors as described herein. That is, these magnetic materials of the magnetic layer 120 may be formulated for a frequency of approximately 5 MHz to 100 MHz, and/or 1 MHz or greater. In some embodiments, the magnetic materials of the magnetic layer 120 may include ferroelectric (or ferrite) materials, conductive materials (or powders), epoxy materials, combinations thereof, and/or any similar magnetic materials. The ferroelectric materials may include, but are not limited to, hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, yttrium-doped (Y-doped) hafnium oxide, and/or the like. The conductive materials may include, but are not limited to, iron, cobalt, silicon, and/or the like.

In some embodiments, the magnetic layer 120 may have a thickness that is substantially equal to a thickness of the substrate layer 150. In other embodiments, the magnetic layer 120 may have a thickness that is different than a thickness of the substrate layer 150 (e.g., the thickness of the magnetic layer 120 may +/−10% of the thickness of the substrate layer 150). For one embodiment, the magnetic layer 120 may have a thickness of approximately 200 um to 1.5 mm. In other embodiments, the magnetic layer 120 may have a thickness of approximately 200 um or less. Accordingly, the magnetic layer 120 may have a top surface that is substantially coplanar to a top surface of the substrate layer 150.

In some embodiments, the dielectric layer 130 may surround (or embed) the magnetic layer 120 and the substrate layer 150, where the dielectric layer 130 may be disposed over/under the magnetic layer 120 and the substrate layer 150. The dielectric layer 130 may be disposed between the magnetic layer 120 and the substrate layer 150, where the dielectric layer 130 may fully separate (or isolate) the magnetic layer 120 and the substrate layer 150. In one embodiment, the dielectric layer 130 may have a top thickness (defined from the top surfaces of the magnetic and substrate layers 120 and 150 to the top surface of the dielectric layer 130) that is substantially equal to a bottom thickness (defined from the bottom surfaces of the magnetic and substrate layers 120 and 150 to the bottom surface of the dielectric layer 130).

Additionally, as shown in FIG. 1, the conductive layer 110 may be a top conductive layer, and the conductive layer 111 may be a bottom conductive layer. That is, the top conductive layer 110 may be disposed on a top surface of the dielectric layer 130, and the bottom conductive layer 111 may be disposed on a bottom surface of the dielectric layer 130. In one embodiment, the top conductive layer 110 may be patterned with one or more openings 164 that expose the top surface of the dielectric layer 130. In an embodiment, the opening(s) 164 may have a width of approximately 20 um to 500 um. In another embodiment, the opening(s) 164 may have a width of approximately 20 um or less.

For one embodiment, the conductive layers 110-111 may be formed using a lithographic patterning and deposition process or the like. According to an embodiment, the deposition process may be any suitable deposition process, such as electroless plating or the like. In one embodiment, the conductive layers 110-111 may be formed using any type of conductive material including a copper layer (or a copper seed layer), and/or a combination of one or more conductive (or metallic) materials.

For one embodiment, the conductive layers 110-111 may be patterned and plated to implement PTH vias 140-141 through the dielectric layer 130 and the substrate layer 150. For example, a laser/drilling process (or a laser through hole (LTH) process) may be implemented through the dielectric and substrate layers 130 and 150 to form via openings, and then a PTH process may be implemented in the via openings to dispose (or form) the PTH vias 140-141 that couple the conductive layers 110-111. For one embodiment, the PTH vias 140-141 may be laser-plated vias formed with any existing process such as an electroless copper plating process or the like.

As shown in FIG. 1, in some embodiments, the PTH vias 140-141 may have substantially vertical sidewalls. In other embodiments, the PTH vias 140-141 may have tapered sidewalls. The PTH vias 140-141 may have conductive sidewalls (e.g., copper sidewalls) that surround the resin 170 (or the resin layer/material), where the conductive sidewalls vertically extend from the bottom conductive layer 111 to the top conductive layer 110. In one embodiment, the resin 170 may have top and bottom surfaces (or exposed top and bottom surfaces) that are substantially coplanar to the respective top and bottom surfaces of the top and bottom conductive layers 110-111. For one embodiment, the resin 170 may include one or more filler materials such as epoxy, glass (or glass fibers), or the like, and/or any combination thereof.

In an embodiment, the PTH vias 140-141 may have a thickness of approximately 300 um to 400 um. In another embodiment, the PTH vias 140-141 may have a thickness of approximately 300 um to 3000 um. Also, for one embodiment, the PTH vias 140-141 may have a thickness of approximately 300 um or less. For some embodiments, the PTH via 140 (or a first PTH via) may have a thickness that is approximately equal to a thickness of the PTH via 141 (or a second PTH via). In an embodiment, the PTH vias 140-141 may have a width of approximately 75 um to 200 um. For another embodiment, the PTH vias 140-141 may have a width of approximately 75 um or less. In some embodiments, the PTH via 140 may have a width that is approximately equal to a width of the PTH via 141. In alternate embodiments, the PTH via 140 may have a width that is different from a width of the PTH via 141.

Note that the insulator 100 may include fewer or additional packaging components based on the desired packaging design.

FIGS. 2A-2I are illustrations of cross-sectional views of a process flow to form an inductor 200 with a magnetic layer 220, a dielectric layer 230, a substrate layer 250, a plurality of PTH vias 240-241, and a plurality of conductive layers 210-211, according to some embodiments. The process flow illustrated in FIGS. 2A-2I forms the inductor 200 that is substantially similar to the inductor 100 described above in FIG. 1. Likewise, the components of the inductor 200 may be substantially similar to the components of the inductor 100 described above in FIG. 1. For example, the magnetic layer 220, the dielectric layer 230, the substrate layer 250, the PTH vias 240-241, the conductive layers 210-211, the resin 270, and the opening 264 of the inductor 200 may be substantially similar to the magnetic layer 120, the dielectric layer 130, the substrate layer 150, the PTH vias 140-141, the conductive layers 110-111, the resin 170, and the opening 164 of the inductor 100 described above in FIG. 1.

Figure 2A:
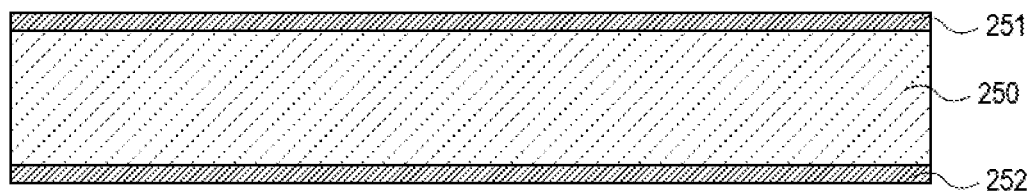
FIGS. 2A-2I are illustrations of cross-sectional views of a process flow to form an inductor with a magnetic layer, a dielectric layer, a substrate layer, a plurality of PTH vias, and a plurality of conductive layers, according to some embodiments.
Figure 2B:
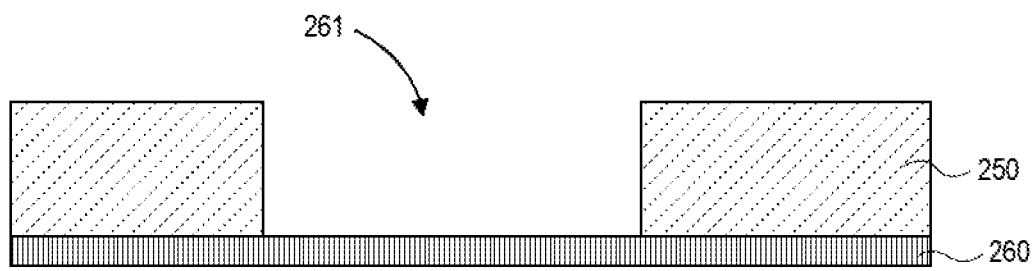
Figure 2C:
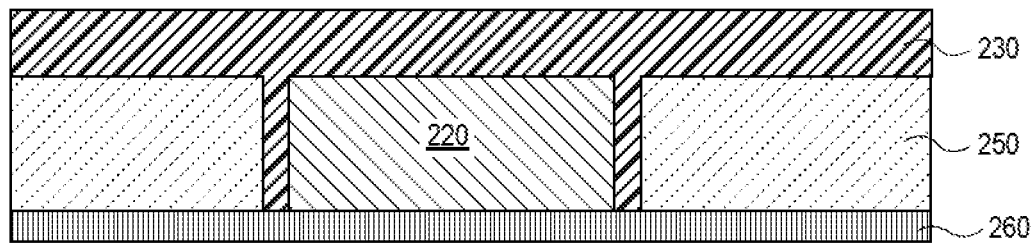
Figure 2D:
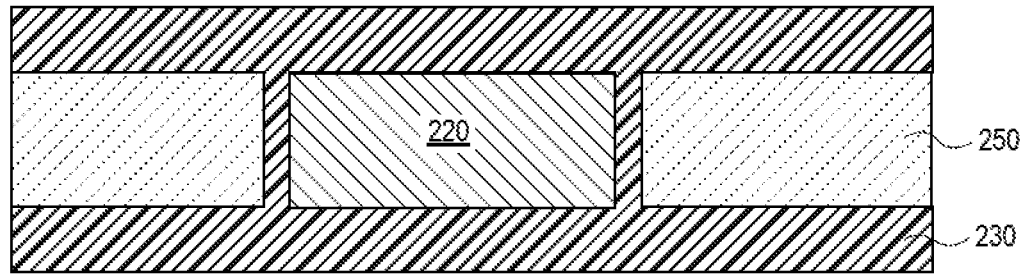
Figure 2E:
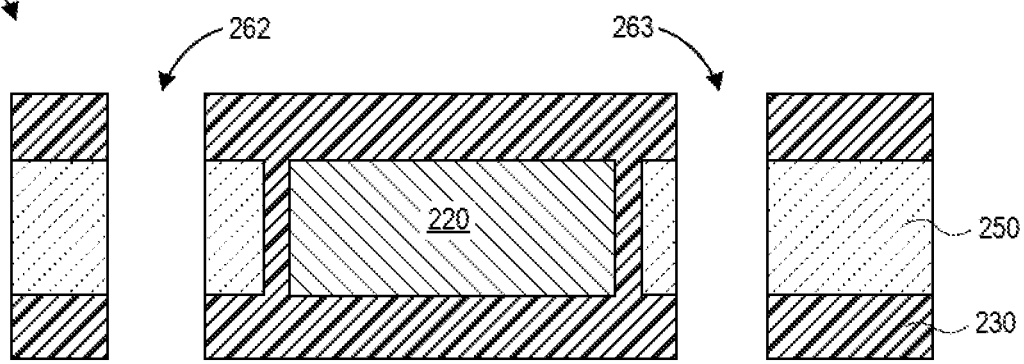
Figure 2F:
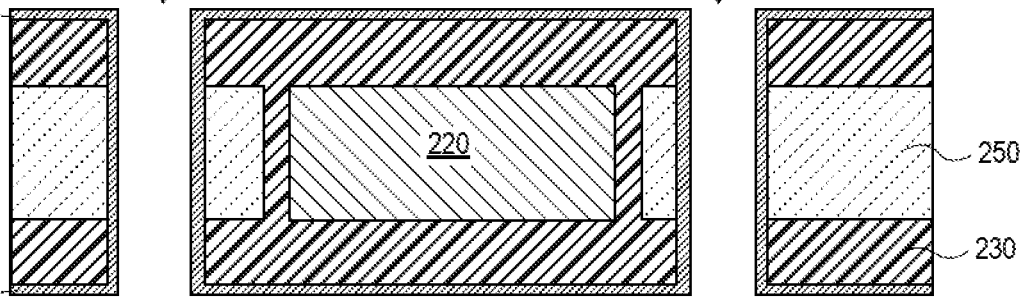
Figure 2G:
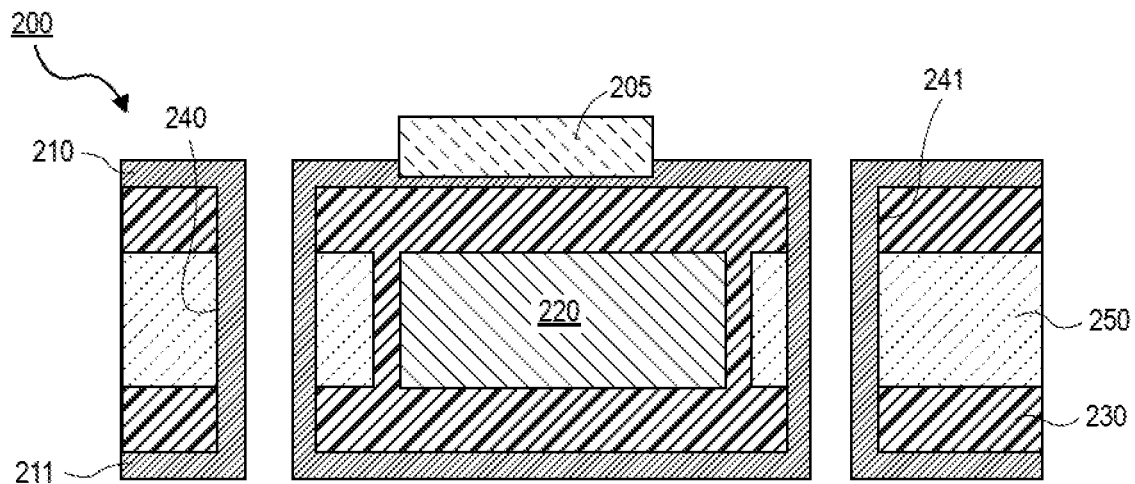
Figure 2H:
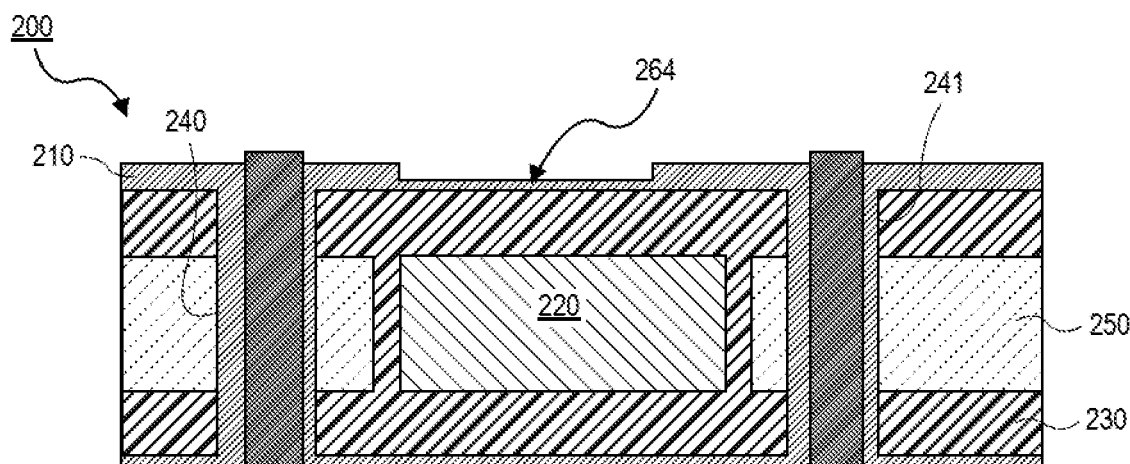
Figure 2I:
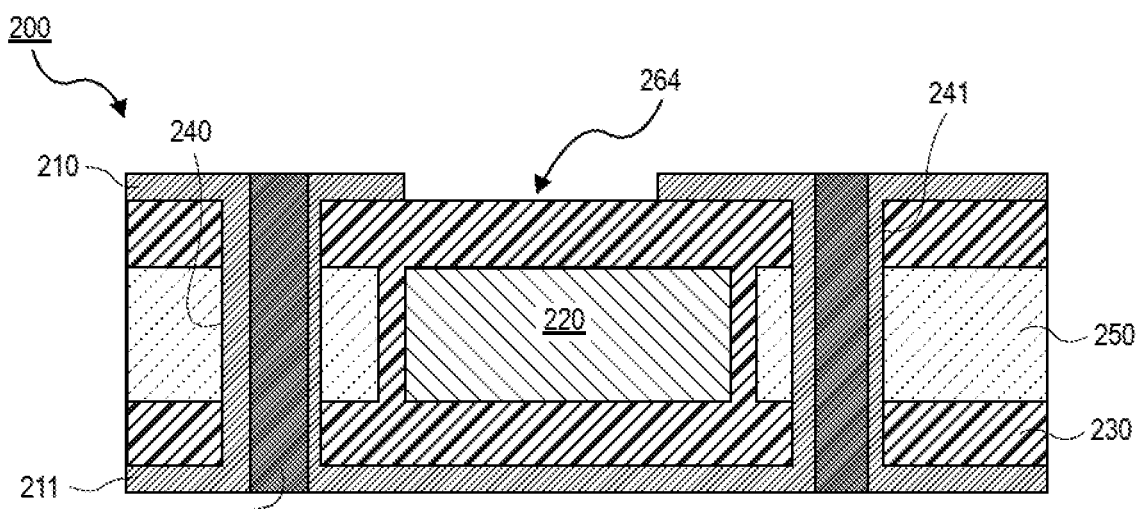

The process flow illustrated in FIGS. 2A-2I illustrates one of the approaches to embed (or dispose) the magnetic layer 220 into the substrate layer 250 and the dielectric layer 230, where the PTH vias 240-241 and the conductive layers 210-211 may be implemented to form a plurality of conductive windings around the magnetic layer 220. In some embodiments, the embedded magnetic layer 220 and the conductive windings of the PTH vias 240-241 and the conductive layers 210-211 may be implemented to form the embedded magnetic inductor 200 as shown in FIG. 2I. Additionally, as described above, the inductor 200 may be implemented with one or more shaped configurations, such as a toroidal shape, a solenoid shape, a bar (or a rectangular) shape, a circular shape, and/or the like.

Referring now to FIG. 2A, a cross-sectional illustration of an inductor 200 is shown, in accordance with an embodiment. In an embodiment, the inductor 200 may include a substrate layer 250 with a plurality of conductive layers 251-252. For one embodiment, the substrate layer 250 may be an organic core substrate (or the like) with a top conductive layer 251 and a bottom conductive layer 252. In some embodiments, the top conductive layer 251 may be disposed on a top surface of the substrate layer 250, and the bottom conductive layer 252 may be disposed on a bottom surface of the substrate layer 250. In one embodiment, the substrate layer 250 may be disposed with a pick-and-place process (or the like) to initially form the inductor 200.

Referring now to FIG. 2B, a cross-sectional illustration of an inductor 200 is shown, in accordance with an embodiment. In an embodiment, the substrate layer 250 may be disposed over an adhesive layer 260. For one embodiment, the conductive layers may be removed from the substrate layer 250 as such the bottom surface of the substrate layer 250 may be directly disposed on the adhesive layer 260. The adhesive layer 260 may be a temporary adhesive tape/film, a backside tape, or the like.

As shown in FIG. 2B, the substrate layer 250 may be patterned and routed using one of several known processes. For example, an opening 261 may be patterned through (or into) the substrate layer 250, where the opening 261 may be patterned (or shaped) to house a desired magnetic layer as shown below in FIG. 2C. The opening 261 of the substrate layer 250 may expose the top surface of the adhesive layer 260.

Referring now to FIG. 2C, a cross-sectional illustration of an inductor 200 is shown, in accordance with an embodiment. In an embodiment, a magnetic layer 220 may be disposed into the opening 261 of the substrate layer 250, where the magnetic layer 220 may be accurately and directly disposed (or positioned) on the top surface of the adhesive layer 260. For example, the magnetic layer 220 may be surrounded by the substrate layer 250, where the magnetic layer 220 may have spacings between the outer sidewalls (or edges) of the magnetic layer 220 and the substrate layer 250 that are substantially equal in width. In some embodiments, the magnetic layer 220 may be disposed into the substrate layer 250 as a solid magnetic portion using an embedding process (or the like), and/or as a suitable magnetic material(s) that may be cured using a heating process (or the like). Furthermore, a dielectric layer 230 may be disposed over the magnetic layer 220, the substrate layer 250, and the adhesive layer 260, where the dielectric layer 230 may thus fill the spacings between the magnetic layer 220 and the substrate layer 250.

Referring now to FIG. 2D, a cross-sectional illustration of an inductor 200 is shown, in accordance with an embodiment. In an embodiment, the adhesive layer may be removed from below (or underneath) the magnetic layer 220 and the substrate layer 250. After the removal of the adhesive layer, the dielectric layer 230 may be further disposed over the exposed bottom surfaces of the magnetic layer 220 and the substrate layer 250. In one embodiment, the dielectric layer 230 may have a top thickness (defined from the top surfaces of the magnetic and substrate layers 220 and 250 to the top surface of the dielectric layer 230) that is substantially equal to a bottom thickness (defined from the bottom surfaces of the magnetic and substrate layers 220 and 250 to the bottom surface of the dielectric layer 230).

Referring now to FIG. 2E, a cross-sectional illustration of an inductor 200 is shown, in accordance with an embodiment. In an embodiment, a plurality of via openings 262-263 may be patterned (or drilled) through the dielectric layer 230 and the substrate layer 250. As described above, the via openings 262-263 may be implemented (or patterned) with a PTH laser/drilling process (or the like) to subsequently form a plurality of PTH vias as shown below in the following packaging steps.

Referring now to FIG. 2F, a cross-sectional illustration of an inductor 200 is shown, in accordance with an embodiment. In an embodiment, a plurality of conductive layers 210-211 may be respectively disposed over the top and bottom surfaces of the dielectric layer 230, where the conductive layers 210-211 may also be disposed into the via openings 262-263 to cover the exposed sidewalls of the dielectric layer 230 and the substrate layer 250. As described above, the conductive layers 210-211 may be disposed initially as a seed layer(s) (e.g., an electroless copper layer) that is implemented (or formed with) an electroless plating process or the like.

Referring now to FIG. 2G, a cross-sectional illustration of an inductor 200 is shown, in accordance with an embodiment. In an embodiment, a resist layer 205 may be patterned and disposed over the conductive layer 210. The resist layer 205 may include a dry film resist (DFR) material or the like. The resist layer 205 may cover a portion of the conductive layer 210, while the conductive material may be further disposed over/on the remaining exposed portions of the conductive layers 210-211. Accordingly, the conductive material of the conductive layers 210-211 may also be disposed into the via openings to form a plurality of PTH vias 240-241. The PTH vias 240-241 may vertically extend from and conductively couple the conductive layer 211 to the conductive layer 210.

Referring now to FIG. 2H, a cross-sectional illustration of an inductor 200 is shown, in accordance with an embodiment. In an embodiment, a resin 270 may be disposed into the PTH vias 240-241. For one embodiment, the resin 270 may be overfilled over/under the PTH vias 240-241 as the top surface of the resin 270 may be above the top surface of the conductive layer 210, and the bottom surface of the resin 270 may be below the bottom surface of the conductive layer 211. Additionally, the resist layer may be removed and thus forms an opening 264 over the previously covered portion of the conductive layer 210.

Referring now to FIG. 2I, a cross-sectional illustration of an inductor 200 is shown, in accordance with an embodiment. In an embodiment, the overfilled portions of the resin 270 may be may be planarized (or removed) with a polishing/grinding process or the like. As a result, in this embodiment, the resin 270 may have a top surface (or an exposed top surface) that is substantially coplanar to a top (or a topmost) surface of the conductive layer 210, while a bottom surface (or an exposed bottom surface) of the resin 270 may be substantially coplanar to a bottom (or a bottommost) surface of the conductive layer 211. Furthermore, the previously covered portion of the conductive layer 210 may be etched (or removed) as the opening 264 now exposes a portion of the top surface of the dielectric layer 230. Note that, in some additional embodiments, the inductor 200 may implement a conventional packaging process to further add (or dispose) subsequent build-up layers (if desired) over the conductive layer 210, the conductive layer 211, the resin 270, and/or the dielectric layer 230. Also note that, in other embodiments, the inductor 200 may dispose a plurality of conductive pads over/under the exposed PTH vias 240-241 (i.e., the conductive pads may be disposed over the top surfaces of the resin 270 and the conductive layer 210, and the bottom surfaces of the resin 270 and the conductive layer 211).

Note that the inductor 200 of FIGS. 2A-2I may include fewer or additional packaging components based on the desired packaging design.

FIGS. 3A-3H are illustrations of cross-sectional views of a process flow to form an inductor 300 with a magnetic layer 320, a dielectric layer 330, a plurality of PTH vias 340-341, and a plurality of conductive layers 310-311, according to some embodiments. The process flow illustrated in FIGS. 3A-3H forms the inductor 300 that is substantially similar to the inductors 100 and 200 described above in FIGS. 1 and 2A-2I, with the exception that the magnetic layer 320 is implemented as the core of the inductor 300. Whereas the magnetic layer 120 is embedded into the substrate layer 150 which is implemented as the core of the inductor 100 in FIG. 1, the magnetic layer 320 is embedded and implemented as the core of the inductor 300 in FIG. 3 without a substrate layer (or an organic core substrate, etc.). Likewise, the components of the inductor 300 may be substantially similar to the components of the inductors 100 and 200 described above in FIGS. 1 and 2A-2I. For example, the magnetic layer 320, the dielectric layer 330, the PTH vias 340-341, the conductive layers 310-311, and the opening 364 of the inductor 300 may be substantially similar to the magnetic layer 120, the dielectric layer 130, the PTH vias 140-141, the conductive layers 110-111, and the opening 164 of the inductor 100 described above in FIG. 1.

Figure 3A:
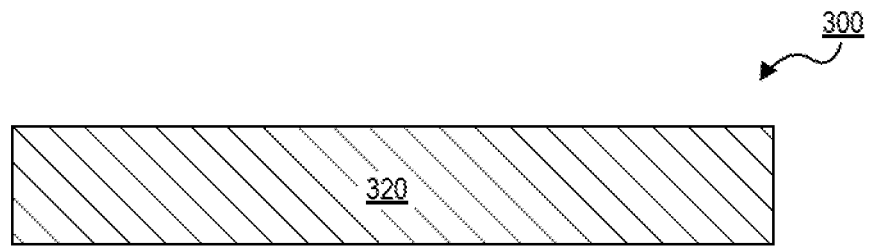
FIGS. 3A-3H are illustrations of cross-sectional views of a process flow to form an inductor with a magnetic layer, a dielectric layer, a plurality of PTH vias, and a plurality of conductive layers, according to some embodiments.
Figure 3B:
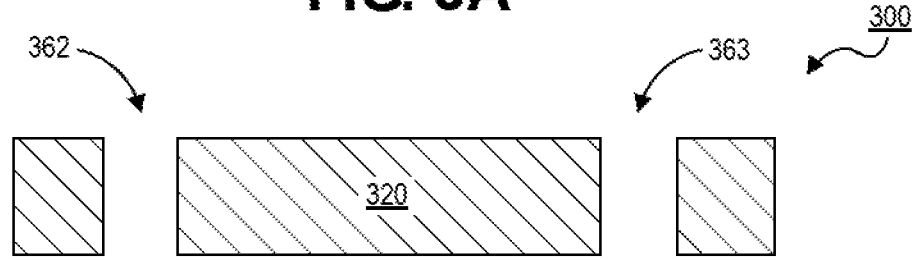
Figure 3C:
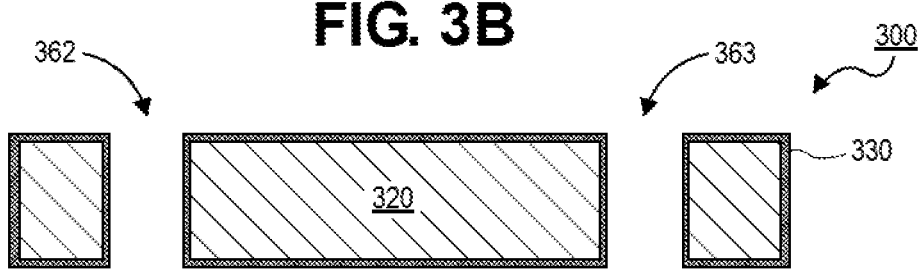
Figure 3D:
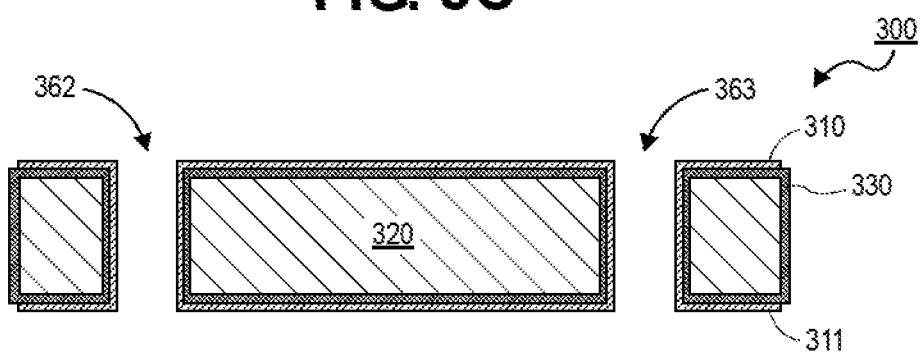
Figure 3E:
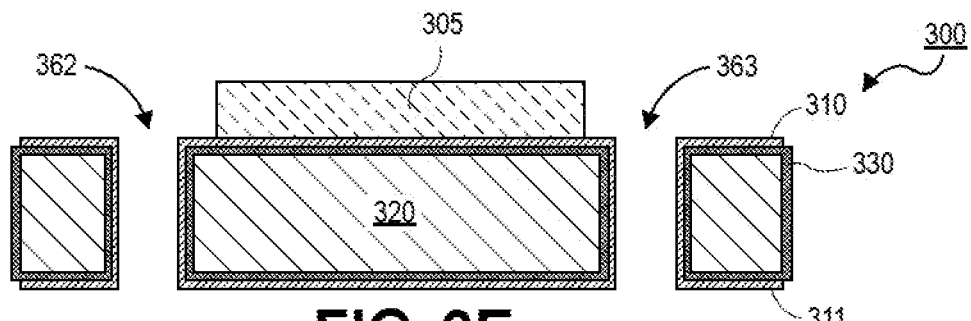
Figure 3F:
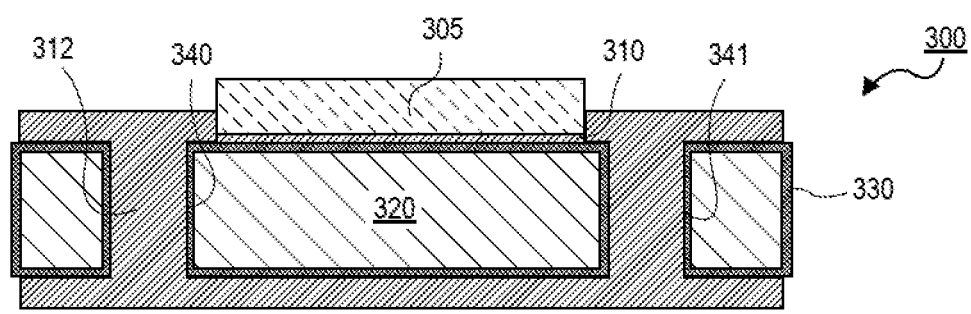
Figure 3G:
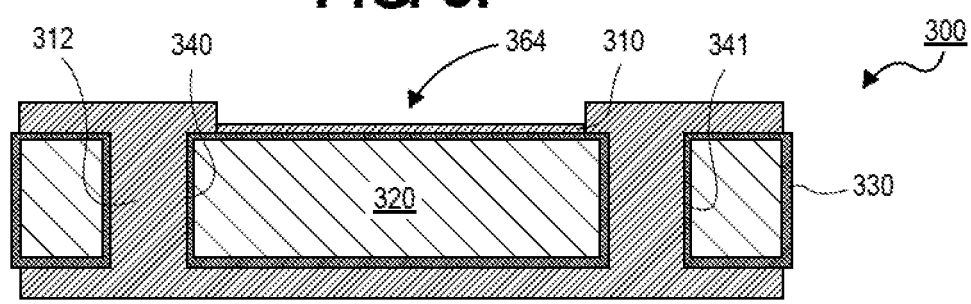
Figure 3H:
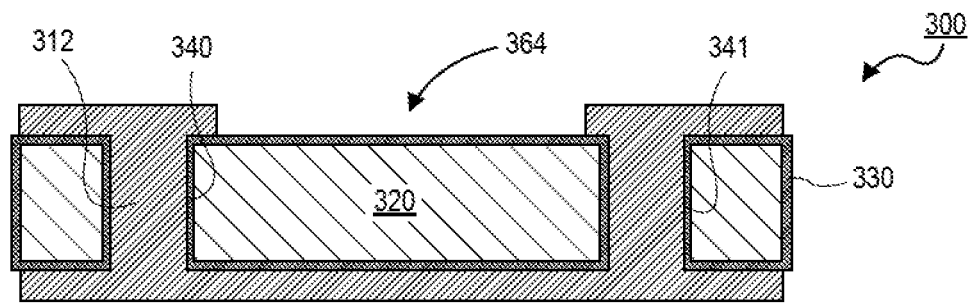

The process flow illustrated in FIGS. 3A-3H illustrates another approach to embed (or dispose) the magnetic layer 320 into the dielectric layer 330 (e.g., as opposed to a magnetic layer being embedded into a substrate layer as shown in FIG. 1), where the PTH vias 340-341 and the conductive layers 310-311 may be implemented to form a plurality of conductive windings around the magnetic layer 320. In some embodiments, the embedded magnetic layer 320 and the conductive windings of the PTH vias 340-341 and the conductive layers 310-311 may be implemented to form the embedded magnetic inductor 300 as shown in FIG. 3H. Additionally, as described above, the inductor 300 may be implemented with one or more shaped configurations, such as a toroidal shape, a solenoid shape, a bar (or a rectangular) shape, a circular shape, and/or the like.

Referring now to FIG. 3A, a cross-sectional illustration of an inductor 300 is shown, in accordance with an embodiment. In an embodiment, a magnetic layer 320 may be implemented as the core (or the magnetic core) of the inductor 300. In one embodiment, the magnetic layer 320 may be disposed with a pick-and-place process (or the like) to initially form the inductor 300.

Referring now to FIG. 3B, a cross-sectional illustration of an inductor 300 is shown, in accordance with an embodiment. In an embodiment, the inductor 300 may include a plurality of via openings 362-363 may be patterned (or drilled) through the magnetic layer 320. As described above, the via openings 362-363 of the magnetic layer 320 may be implemented (or patterned) with a PTH laser process, a mechanical drilling process, or the like to subsequently form a plurality of PTH vias in the magnetic layer 320, as shown below in the following packaging steps.

Referring now to FIG. 3C, a cross-sectional illustration of an inductor 300 is shown, in accordance with an embodiment. In an embodiment, a dielectric layer 330 may be disposed (or coated) over and around the magnetic layer 320. In one embodiment, the dielectric layer 330 may include a dielectric material, a polymer material, or the like. The dielectric layer 330 may surround the magnetic layer 320, where the dielectric layer 330 may be implemented as a barrier between the magnetic layer 320 and the subsequently formed conductive windings as shown below in the following packaging steps.

Referring now to FIG. 3D, a cross-sectional illustration of an inductor 300 is shown, in accordance with an embodiment. In an embodiment, a plurality of conductive layers 310-311 may be respectively disposed over the top and bottom surfaces of the magnetic layer 320, where the conductive layers 310-311 may also be disposed into the via openings 362-363 to cover the exposed sidewalls of the magnetic layer 320. As described above, the conductive layers 310-311 may be disposed initially as a seed layer(s) (e.g., an electroless copper layer) that is implemented (or formed with) an electroless plating process or the like.

Referring now to FIG. 3E, a cross-sectional illustration of an inductor 300 is shown, in accordance with an embodiment. In an embodiment, a resist layer 305 may be patterned and disposed over the conductive layer 310. The resist layer 305 may include DFR material or the like. The resist layer 305 may cover a portion of the conductive layer 310.

Referring now to FIG. 3F, a cross-sectional illustration of an inductor 300 is shown, in accordance with an embodiment. In an embodiment, the conductive material 112 (e.g., copper or the like) may be further disposed over/on the remaining exposed portions of the conductive layers 310-311. Accordingly, the conductive material 312 may also be disposed into the via openings to form a plurality of PTH vias 340-341. The PTH vias 340-341 may vertically extend from and conductively couple the conductive layer 311 to the conductive layer 310. The conductive material 312 of the PTH vias 340-341 may be disposed between and through the magnetic layer 320. The conductive material 312 may be implemented with a conventional conductive plating process (or the like) to create shapes such as a toroidal and so on, with the exception that the PTH vias 340-341 are now implemented through the magnetic layer 320. Note that, in some embodiments, the conductive layers 310-311 may be planarized with a polishing/grinding process or the like.

Referring now to FIG. 3G, a cross-sectional illustration of an inductor 300 is shown, in accordance with an embodiment. In an embodiment, the resist layer may be removed and thus forms an opening 364 over the previously covered portion of the conductive layer 310.

Referring now to FIG. 3H, a cross-sectional illustration of an inductor 300 is shown, in accordance with an embodiment. In an embodiment, the previously covered portion of the conductive layer 310 may be etched (or removed) as the opening 364 now exposes a portion of the top surface of the dielectric layer 330. Note that, in some additional embodiments, the inductor 300 may implement a conventional packaging process to further add (or dispose) subsequent build-up layers (if desired) over the conductive layer 310, the conductive layer 311, the PTH vias 340-341, and/or the dielectric 330.

Note that the inductor 300 of FIGS. 3A-3H may include fewer or additional packaging components based on the desired packaging design.

Figure 4C:
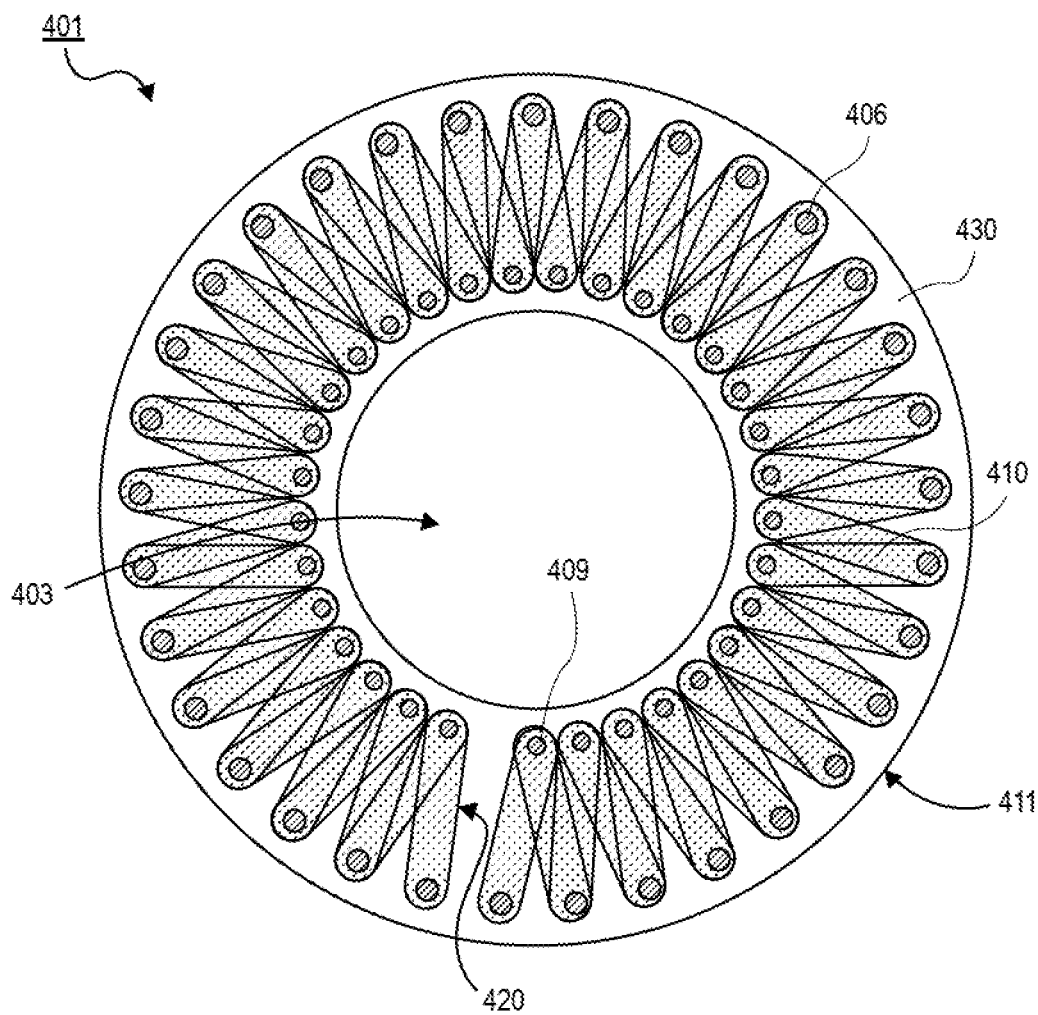
FIG. 4C is an illustration of a cross-sectional view of a toroidal inductor with a magnetic layer, a plurality of PTH vias, and a plurality of conductive layers, according to one embodiment.

FIGS. 4A-4B are illustrations of a plan view and a respective cross-sectional view a toroidal magnetic inductor 400 with a magnetic layer 420, a plurality of PTH vias 406-409, a plurality of openings 403 and 405, and a plurality of conductive layers 410-411, and a dielectric layer 450, according to some embodiments. FIG. 4C is an illustration of a plan view of a toroidal magnetic inductor 401 with a magnetic layer 420, a plurality of PTH vias 406 and 409, an opening 403, a plurality of conductive layers 410-411, and a dielectric layer 430, according to some embodiments.

The toroidal magnetic inductors 400-401 may be substantially similar to the inductors 100, 200, and 300 described above in FIGS. 1, 2A-2I, and 3A-3H. Likewise, the components of the toroidal magnetic inductors 400-401 may be substantially similar to the components of the inductor 100 described above in FIG. 1. Accordingly, as described above, the magnetic layer 420, the PTH vias 406-409, the openings 403 and 405, and the conductive layers 410-411 of the toroidal magnetic inductors 400-401 may be substantially similar to the magnetic layer 120, the PTH vias 140-141, the opening 164, and the conductive layers 110-111 of the inductor 100 described above in FIG. 1.

Referring now to FIGS. 4A-4B, a plan view illustration and a respective cross-sectional illustration of a toroidal magnetic inductor 400 is shown, in accordance with an embodiment. In an embodiment, the toroidal magnetic inductor 400 may include the conductive layer 410 (or the top conductive layer) and the conductive layer 411 (or the bottom conductive layer) that are conductively coupled with the PTH vias 406-409. The conductive layer 410 may be implemented on the top layer for the conductive routing of the toroidal magnetic inductor 400, and the conductive layer 411 may be implemented on the bottom layer for the conductive routing of the toroidal magnetic inductor 400. Additionally, as shown in FIG. 4A, an inner opening 403 may be positioned at the center of the toroidal magnetic inductor 400, while openings 405 may cut (or slice) from the inner opening 403 towards the outer edges of the toroidal magnetic inductor 400.

Also, as shown in FIG. 4B, the PTH vias 406-409 may extend vertically from the bottom conductive layer 411 to the top conductive layer 410, where the PTH vias 406-409 may conductively couple the conductive routings of the toroidal magnetic inductor 400. In some embodiments, the PTH vias 406 may be positioned on the outer edges of the toroidal magnetic inductor 400, while the PTH vias 407-409 may be positioned around the inner opening 403 and near the inner edges of the toroidal magnetic inductor 400 (e.g., as shown with the PTH vias 406-409 of FIG. 4A). Furthermore, as shown in FIG. 4B, the PTH vias 406-409 may surround (or enclose) the magnetic layer 420 to form the toroidal magnetic inductor 400.

In one embodiment, the magnetic layer 420 may also be embedded (or surrounded) with a substrate layer and/or a dielectric layer (e.g., as shown with magnetic layer 120, the substrate layer 150, and the dielectric layer 130 of FIG. 1). As described above, the PTH vias 440-441 and the conductive layers 410-411 may be implemented to form the conductive windings around the magnetic layer 420. In some embodiments, the magnetic layer 420 may be embedded with the conductive windings of the PTH vias 440-441 and the conductive layers 410-411 to form the toroidal magnetic inductor 400. As described above, the toroidal shape allows for a well-defined, closed flux path in the magnetic layer 420 of the toroidal magnetic inductor 400, which thus allows the inductance of the toroidal magnetic inductor 400 to be controlled approximately as the square of the number of conductive windings/turns of the conductive layers 410-411 and the PTH vias 440-441 routed around the magnetic layer 420. Likewise, in other embodiments, the toroidal magnetic inductor 400 may be implemented with other shapes (or configurations), such as a solenoid wrapped around a rectangular magnetic core, a bar (or rectangle) wrapped around a rectangular magnetic core, and so on. Note that, in some embodiments, the magnetic layer 420 may have a rectangular shape, a circular (or rounded-edges) shape, and so on.

Referring now to FIG. 4C, a plan view illustration of a toroidal magnetic inductor 401 is shown, in accordance with an embodiment. The toroidal magnetic inductor 401 of FIG. 4C may be substantially similar to the toroidal magnetic inductor 400 of FIG. 4A-4B. In one embodiment, the toroidal magnetic inductor 401 may include the magnetic layer 420, the PTH vias 406 and 409, the opening 403, and the dielectric layer 430. As described above, in some embodiments, the toroidal magnetic inductor 401 may include the dielectric layer 430 disposed between the conductive layers 410-411, where the toroidal magnetic inductor 401 may surround (or enclose/embed) the magnetic layer 420 and the PTH vias 406 and 409.

Note that the toroidal magnetic inductors 400-401 of FIGS. 4A-4C may include fewer or additional packaging components based on the desired packaging design.

Figure 5:
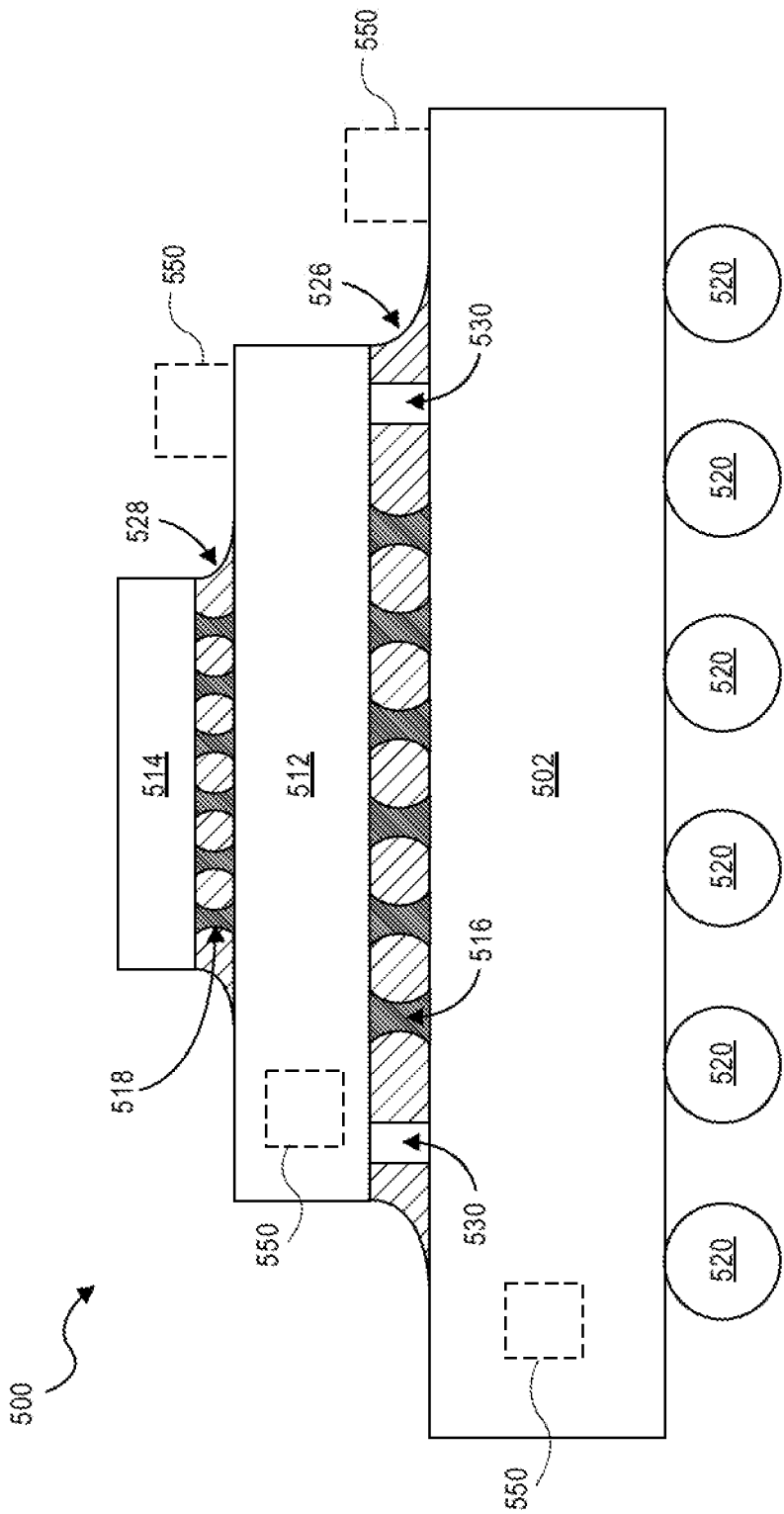
FIG. 5 is an illustration of a cross-sectional view of a semiconductor packaged system including a die, a substrate, a package substrate, and an inductor, according to one embodiment.

FIG. 5 is an illustration of a cross-sectional view of a semiconductor packaged system 500 including a die 514, a substrate 512, a package substrate 502, and a magnetic inductor 550, according to one embodiment. FIG. 5 illustrates a semiconductor package 500 including a die 514, a substrate 512 (or an interposer), interconnect structures (e.g., the plurality of bumps disposed below the die 514 and the substrate 512), and the package substrate 502, where the substrate 512 and/or the package substrate 502 may include one or more magnetic inductors 550, and where the magnetic inductors 550 may have magnetic layers, dielectric layers, substrate layers, conductive layers, and PTH vias (e.g., filled with resin and/or conductive material), according to some embodiments.

For one embodiment, the semiconductor package 500 may implement the substrate 512 and/or the package substrate 502 to include the magnetic inductors 550. For example, in one embodiment, the magnetic inductors 550 may be embedded within the package substrate 502 and/or the substrate 512. In another embodiment, the magnetic inductors 550 may also be disposed on/over the package substrate 502 and/or the substrate 512. In some embodiment, the magnetic inductors 550 of the substrate 512 and/or the package substrate 502 may be substantially similar to the inductors 100, 200, 300, and 400-401 described above in FIGS. 1, 2A-2I, 3A-3H, and 4A-4C. Note that the semiconductor package 500 is not limited to the illustrated semiconductor packaged system, and thus may be designed/formed with fewer, alternate, or additional packaging components and/or with different interconnecting structures.

According to one embodiment, the semiconductor package 500 is merely one example of an embodiment of a semiconductor packaged system. For one embodiment, the semiconductor package 500 may include a ball grid array (BGA) package, a land grid array (LGA) package, and/or a pin grid array (PGA) package. For one embodiment, a die 514 is coupled to a substrate 512 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 514, the substrate 512, and the package substrate 502 may be coupled using anisotropic conductive film (ACF). For one embodiment, the substrate 512 may be, but is not limited to, a silicon interposer and/or a die with through silicon vias (TSVs). For an alternate embodiment, the semiconductor package 500 may omit the interposer/substrate 512.

For some embodiments, the semiconductor package 500 may have the die 514 disposed on the interposer 512, where both the stacked die 514 and interposer 512 are disposed on a package substrate 502. According to some embodiments, the package substrate 502 may include, but is not limited to, a package, a substrate, a PCB, and a motherboard. For one embodiment, the package substrate 502 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 502 may also include conductive layers that comprise copper lines/traces, metallic pads, vias, via pads, planes, and/or holes.

For one embodiment, the die 514 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 514 may be formed from a material such as silicon and have circuitry thereon that is to be coupled to the interposer 512. Although some embodiments are not limited in this regard, the package substrate 502 may in turn be coupled to another body, for example, a computer motherboard. One or more connections between the package substrate 502, the interposer 512, and the die 514—e.g., including some or all of bumps 516, 518, and 520—may include one or more interconnect structures and underfill layers 526 and 528. In some embodiments, these interconnect structures (or connections) may variously comprise an alloy of nickel, palladium, and tin (and, in some embodiments, copper).

Connections between the package substrate 502 and another body may be made using any suitable structure, such as the illustrative bumps 520 shown. The package substrate 502 may include a variety of electronic structures formed thereon or therein. The interposer 512 may also include electronic structures formed thereon or therein, which may be used to couple the die 514 to the package substrate 502. For one embodiment, one or more different materials may be used for forming the package substrate 502 and the interposer 512. In certain embodiments, the package substrate 502 is an organic substrate made up of one or more layers of polymer base material, with conducting regions for transmitting signals. In certain embodiments, the interposer 512 is made up of a ceramic base material including metal regions for transmitting signals. Although some embodiments are not limited in this regard, the semiconductor package 500 may include gap control structures 530—e.g., positioned between the package substrate 502 and the interposer 512. Such gap control structures 530 may mitigate a change in the height of the gap between the package substrate 502 and the interposer 512, which otherwise might occur during reflowing while die 514 is attached to interposer 512. Note that the semiconductor package 500 includes an underfill material 528 between the interposer 512 and the die 514, and an underflow material 526 between the package substrate 502 and the interposer 512. For one embodiment, the underfill materials (or layers) 526 and 528 may be one or more polymers that are injected between the layers. For other embodiments, the underfill materials may be molded underfills (MUF).

Note that the semiconductor package 500 may include fewer or additional packaging components based on the desired packaging design.

Figure 6:
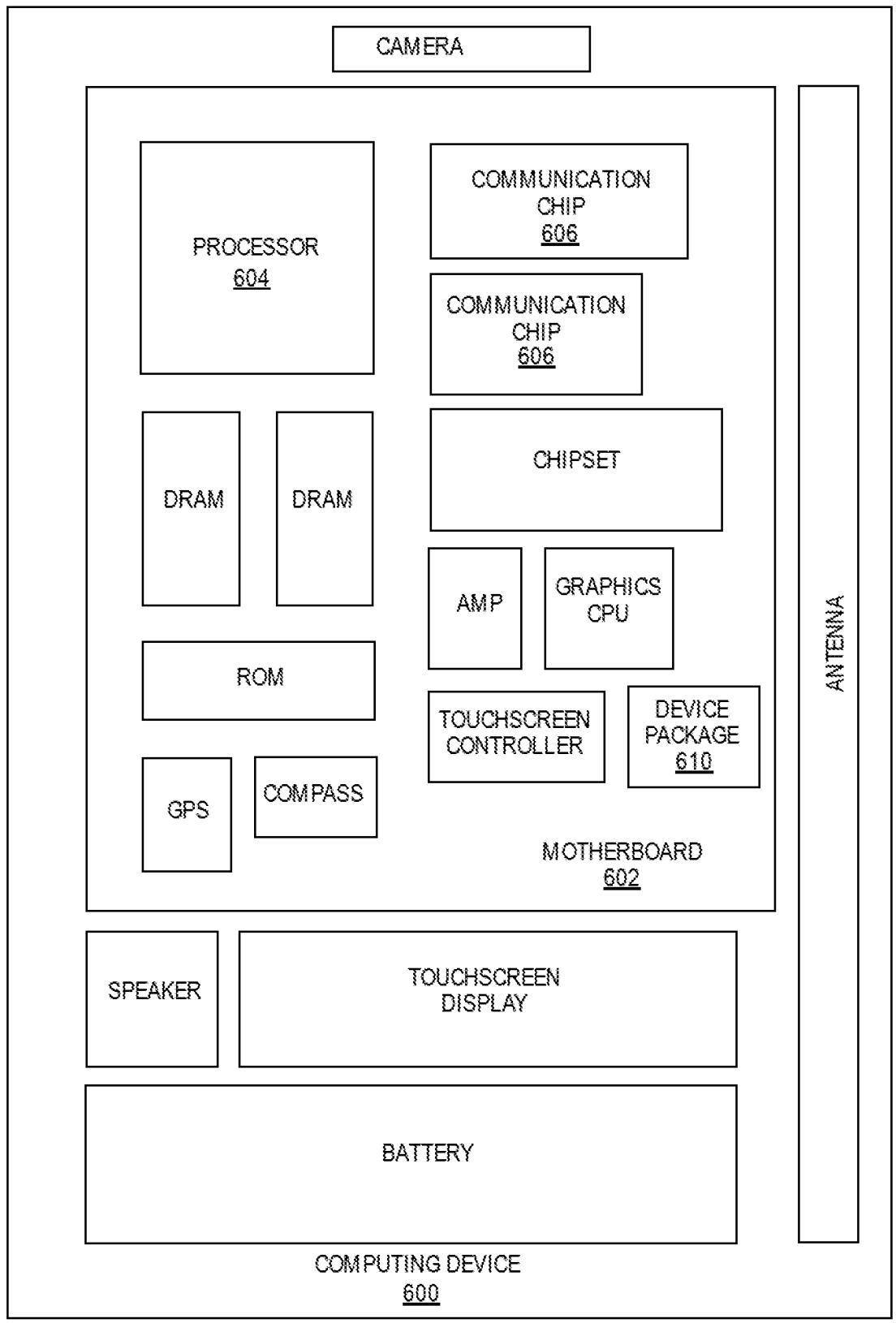
FIG. 6 is an illustration of a schematic block diagram illustrating a computer system that utilizes an inductor with a magnetic layer, a dielectric layer, a substrate layer, a plurality of PTH vias, and a plurality of conductive layers, according to one embodiment.

FIG. 6 is an illustration of a schematic block diagram illustrating a computer system 600 that utilizes a device package 610 (or a semiconductor package) with an embedded magnetic inductor, according to one embodiment. FIG. 6 illustrates an example of computing device 600. Computing device 600 houses a motherboard 602. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be a semiconductor package, a MCP package, or the like. Device package 610 may include, but is not limited to, a substrate, a package substrate, and/or a PCB. Device package 610 may include embedded magnetic inductors with magnetic layers, dielectric layers, substrate layers, conductive layers, and PTH vias as described herein (e.g., as illustrated and described above with the inductors 100, 200, 300, and 400-401 of FIGS. 1, 2A-2I, 3A-3H, and 4A-4C)—or any other components from the figures described herein.

Note that device package 610 may be a single component/device, a subset of components, and/or an entire system, as the materials, features, and components may be limited to device package 610 and/or any other component of the computing device 600 that may need the embedded magnetic inductors as described herein (e.g., the motherboard 602, the processor 604, and/or any other component of the computing device 600 that may need the embodiments of the embedded magnetic inductors as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip 606 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is an inductor, comprising: a substrate layer surrounds a magnetic layer, wherein the magnetic layer is embedded between the substrate layer; a dielectric layer surrounds the substrate layer and the magnetic layer, wherein the dielectric layer fully embeds the substrate layer and the magnetic layer; a first conductive layer over the dielectric layer; a second conductive layer below the dielectric layer; and a plurality of PTH vias in the dielectric layer and the substrate layer, wherein the plurality of PTH vias vertically extend from the first conductive layer to the second conductive layer, and wherein the magnetic layer is in between the PTH vias.

In example 2, the subject matter of example 1 can optionally include that the magnetic layer has a thickness that is substantially equal to a thickness of the substrate layer, and wherein the thickness of the magnetic layer is less than a thickness defined between a top surface of the second conductive layer to a bottom surface of the first conductive layer.

In example 3, the subject matter of examples 1-2 can optionally include that the resin material in the PTH vias, wherein the PTH vias fully surround the resin material; and an opening between the first conductive layer and the PTH vias, wherein the opening is over the dielectric layer and the magnetic layer, and wherein the opening exposes a portion of a top surface of the dielectric layer.

In example 4, the subject matter of examples 1-3 can optionally include that the resin material has a top surface that is substantially coplanar to a top surface of the first conductive layer, and wherein the resin material has a bottom surface that is substantially coplanar to a bottom surface of the second conductive layer.

In example 5, the subject matter of examples 1-4 can optionally include the plurality of PTH vias conductively couple the first conductive layer to the second conductive layer, wherein the plurality of PTH vias have a plurality of sidewalls, and wherein the plurality of sidewalls are a plurality of substantially vertical sidewalls or a plurality of tapered sidewalls.

In example 6, the subject matter of examples 1-5 can optionally include the magnetic layer has a top surface that is substantially coplanar to a top surface of the substrate layer.

In example 7, the subject matter of examples 1-6 can optionally include that the dielectric layer separates outer sidewalls of the magnetic layer from sidewalls of the substrate layer, wherein the first conductive layer is directly on a top surface of the dielectric layer, wherein the second conductive layer is directly on a bottom surface of the dielectric layer, wherein the dielectric layer has a first thickness and a second thickness, wherein the first thickness is defined from top surfaces of the magnetic and substrate layers to the top surface of the dielectric layer, wherein the second thickness is defined from bottom surfaces of the magnetic and substrate layers to the bottom surface of the dielectric layer, and wherein the first thickness of the dielectric layer is substantially equal to the second thickness of the dielectric layer.

In example 8, the subject matter of examples 1-7 can optionally the magnetic layer includes ferroelectric materials, conductive materials, or epoxy materials.

In example 9, the subject matter of examples 1-8 can optionally include that the first and second conductive layers have a toroidal shape, a solenoid shape, or a rectangular shape, and wherein the magnetic layer has a rectangular shape, a circular shape, or a rounded-edge shape.

Example 10 is an inductor, comprising: a dielectric layer surrounds a magnetic layer, wherein the dielectric layer fully embeds the magnetic layer; a first conductive layer over the dielectric layer; a second conductive layer below the dielectric layer; and a plurality of PTH vias in the dielectric layer and the magnetic layer, wherein the plurality of PTH vias vertically extend from the first conductive layer to the second conductive layer, wherein the magnetic layer is in between the PTH vias, and wherein the plurality of PTH vias have a thickness that is substantially equal to a combined thickness of the magnetic layer and the dielectric layer.

In example 11, the subject matter of example 10 can optionally include that the magnetic layer is a magnetic core, and wherein the magnetic layer has a thickness that is greater than a thickness of the dielectric layer.

In example 12, the subject matter of examples 10-11 can optionally include an opening between the first conductive layer and the PTH vias, wherein the opening is over the dielectric layer and the magnetic layer, wherein the opening exposes a portion of a top surface of the dielectric layer, and wherein the plurality of PTH vias include a conductive material that is substantially the same as a conductive material of the first and second conductive layers.

In example 13, the subject matter of examples 10-12 can optionally include that the dielectric layer vertically surrounds the plurality of PTH vias.

In example 14, the subject matter of examples 10-13 can optionally include that the plurality of PTH vias conductively couple the first conductive layer to the second conductive layer, wherein the plurality of PTH vias have a plurality of sidewalls, and wherein the plurality of sidewalls are a plurality of substantially vertical sidewalls or a plurality of tapered sidewalls.

In example 15, the subject matter of examples 10-14 can optionally include that the dielectric layer vertically separates outer sidewalls of the magnetic layer from the plurality of sidewalls of the plurality of PTH vias, wherein the first conductive layer is directly on the top surface of the dielectric layer, wherein the second conductive layer is directly on a bottom surface of the dielectric layer, wherein the dielectric layer has a first thickness and a second thickness, wherein the first thickness is defined from a top surface of the magnetic layer to the top surface of the dielectric layer, wherein the second thickness is defined from a bottom surface of the magnetic layer to the bottom surface of the dielectric layer, and wherein the first thickness of the dielectric layer is substantially equal to the second thickness of the dielectric layer.

In example 16, the subject matter of examples 10-15 can optionally include that the magnetic layer includes ferroelectric materials, conductive materials, or epoxy materials.

In example 17, the subject matter of examples 10-16 can optionally include the first and second conductive layers have a toroidal shape, a solenoid shape, or a rectangular shape, and wherein the magnetic layer has a rectangular shape, a circular shape, or a rounded-edge shape.

Example 18 is a method to form an inductor, comprising: patterning an opening into a substrate layer, wherein a bottom surface of the substrate layer is directly coupled onto an adhesive layer; disposing a magnetic layer into the opening of the substrate layer, wherein the magnetic layer is embedded between the substrate layer, and wherein a bottom surface of the magnetic layer is directly coupled onto the adhesive layer disposing a dielectric layer over the substrate layer, the magnetic layer, and the adhesive layer; removing the adhesive layer from below the substrate layer and the magnetic layer; disposing the dielectric material below the substrate layer and the magnetic layer, wherein the dielectric layer fully surrounds and embeds the substrate layer and the magnetic layer; disposing a plurality of PTH vias in the dielectric layer and the substrate layer, wherein the magnetic layer is in between the PTH vias; and disposing a first conductive layer over the dielectric layer, and a second conductive layer below the dielectric layer, wherein the plurality of PTH vias vertically extend from the first conductive layer to the second conductive layer.

In example 19, the subject matter of example 18 can optionally include that the magnetic layer has a thickness that is substantially equal to a thickness of the substrate layer, and wherein the thickness of the magnetic layer is less than a thickness defined between a top surface of the second conductive layer to a bottom surface of the first conductive layer.

In example 20, the subject matter of examples 18-19 can optionally include that disposing a resin material in the PTH vias, wherein the PTH vias fully surround the resin material; and patterning an opening between the first conductive layer and the PTH vias, wherein the opening is over the dielectric layer and the magnetic layer, and wherein the opening exposes a portion of a top surface of the dielectric layer.

In example 21, the subject matter of examples 18-20 can optionally include that the resin material has a top surface that is substantially coplanar to a top surface of the first conductive layer, and wherein the resin material has a bottom surface that is substantially coplanar to a bottom surface of the second conductive layer.

In example 22, the subject matter of examples 18-21 can optionally include the plurality of PTH vias conductively couple the first conductive layer to the second conductive layer, wherein the plurality of PTH vias have a plurality of sidewalls, and wherein the plurality of sidewalls are a plurality of substantially vertical sidewalls or a plurality of tapered sidewalls.

In example 23, the subject matter of examples 18-22 can optionally include that the magnetic layer has a top surface that is substantially coplanar to a top surface of the substrate layer.

In example 24, the subject matter of examples 18-23 can optionally include that the dielectric layer separates outer sidewalls of the magnetic layer from sidewalls of the substrate layer, wherein the first conductive layer is directly on a top surface of the dielectric layer, wherein the second conductive layer is directly on a bottom surface of the dielectric layer, wherein the dielectric layer has a first thickness and a second thickness, wherein the first thickness is defined from top surfaces of the magnetic and substrate layers to the top surface of the dielectric layer, wherein the second thickness is defined from bottom surfaces of the magnetic and substrate layers to the bottom surface of the dielectric layer, and wherein the first thickness of the dielectric layer is substantially equal to the second thickness of the dielectric layer.

In example 25, the subject matter of examples 18-24 can optionally include that the magnetic layer includes ferroelectric materials, conductive materials, or epoxy materials, wherein the first and second conductive layers have a toroidal shape, a solenoid shape, or a rectangular shape, and wherein the magnetic layer has a rectangular shape, a circular shape, or a rounded-edge shape.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An inductor, comprising:
   a substrate layer that surrounds a magnetic layer, wherein the magnetic layer is embedded between the substrate layer, and wherein the magnetic layer has a sidewall;
   a dielectric layer that surrounds the substrate layer and the magnetic layer, wherein the dielectric layer fully embeds the substrate layer and the magnetic layer, and wherein the dielectric layer is in contact with the sidewall of the magnetic layer;
   a first conductive layer over the dielectric layer;
   a second conductive layer below the dielectric layer; and
   a plurality of plated-through-hole (PTH) vias in the dielectric layer and the substrate layer, wherein the plurality of PTH vias vertically extend from the first conductive layer to the second conductive layer, wherein the magnetic layer is laterally between the plurality of PTH vias, and wherein each one of the plurality of PTH vias is in contact with the substrate layer.

2. The inductor of claim 1, wherein the magnetic layer has a thickness that is substantially equal to a thickness of the substrate layer, and wherein the thickness of the magnetic layer is less than a thickness defined between a top surface of the second conductive layer to a bottom surface of the first conductive layer.

3. The inductor of claim 1, further comprising:
   a resin material in the plurality of PTH vias, wherein the plurality of PTH vias fully surround the resin material; and
   an opening between the first conductive layer and the plurality of PTH vias, wherein the opening is over the dielectric layer and the magnetic layer, and wherein the opening exposes a portion of a top surface of the dielectric layer.

4. The inductor of claim 3, wherein the resin material has a top surface that is substantially coplanar to a top surface of the first conductive layer, and wherein the resin material has a bottom surface that is substantially coplanar to a bottom surface of the second conductive layer.

5. The inductor of claim 3, wherein the dielectric layer separates outer sidewalls of the magnetic layer from sidewalls of the substrate layer, wherein the first conductive layer is directly on a top surface of the dielectric layer, wherein the second conductive layer is directly on a bottom surface of the dielectric layer, wherein the dielectric layer has a first thickness and a second thickness, wherein the first thickness is defined from top surfaces of the magnetic and substrate layers to the top surface of the dielectric layer, wherein the second thickness is defined from bottom surfaces of the magnetic and substrate layers to the bottom surface of the dielectric layer, and wherein the first thickness of the dielectric layer is substantially equal to the second thickness of the dielectric layer.

6. The inductor of claim 1, wherein the plurality of PTH vias conductively couple the first conductive layer to the second conductive layer, wherein the plurality of PTH vias have a plurality of sidewalls, and wherein the plurality of sidewalls are a plurality of substantially vertical sidewalls or a plurality of tapered sidewalls.

7. The inductor of claim 1, wherein the magnetic layer has a top surface that is substantially coplanar to a top surface of the substrate layer.

8. The inductor of claim 1, wherein the magnetic layer includes ferroelectric materials, conductive materials, or epoxy materials.

9. The inductor of claim 1, wherein the first and second conductive layers have a toroidal shape, a solenoid shape, or a rectangular shape, and wherein the magnetic layer has a rectangular shape, a circular shape, or a rounded-edge shape.

10. An inductor, comprising:
    a substrate layer that surrounds a magnetic layer, wherein the magnetic layer is embedded between the substrate layer, and wherein the magnetic layer has a sidewall;
    a dielectric layer that surrounds the substrate layer and the magnetic layer, wherein the dielectric layer fully embeds the substrate layer and the magnetic layer, and wherein the dielectric layer is in contact with the sidewall of the magnetic layer;
    a first conductive layer over the dielectric layer;
    a second conductive layer below the dielectric layer;
    a plurality of plated-through-hole (PTH) vias in the dielectric layer and the substrate layer, wherein the plurality of PTH vias vertically extend from the first conductive layer to the second conductive layer, and wherein the magnetic layer is laterally between the plurality of PTH vias;
    a resin material in the plurality of PTH vias, wherein the plurality of PTH vias fully surround the resin material; and
    an opening between the first conductive layer and the plurality of PTH vias, wherein the opening is over the dielectric layer and the magnetic layer, and wherein the opening exposes a portion of a top surface of the dielectric layer, wherein the dielectric layer separates outer sidewalls of the magnetic layer from sidewalls of the substrate layer, wherein the first conductive layer is directly on a top surface of the dielectric layer, wherein the second conductive layer is directly on a bottom surface of the dielectric layer, wherein the dielectric layer has a first thickness and a second thickness, wherein the first thickness is defined from top surfaces of the magnetic and substrate layers to the top surface of the dielectric layer, wherein the second thickness is defined from bottom surfaces of the magnetic and substrate layers to the bottom surface of the dielectric layer, and wherein the first thickness of the dielectric layer is substantially equal to the second thickness of the dielectric layer.

* * * * *